US009823479B2

(12) United States Patent
Mitra

(10) Patent No.: US 9,823,479 B2
(45) Date of Patent: Nov. 21, 2017

(54) DEVICE FOR SHAPING LASER RADIATION

(71) Applicant: LIMO Patentverwaltung GmbH & Co. KG, Dortmund (DE)

(72) Inventor: Thomas Mitra, Dortmund (DE)

(73) Assignee: LIMO PATENTVERWALTUNG GMBH & CO. KG, Dortmund (DE)

( * ) Notice: Subject to any disclaimer, the term of this patent is extended or adjusted under 35 U.S.C. 154(b) by 0 days.

(21) Appl. No.: 15/035,597

(22) PCT Filed: Dec. 15, 2014

(86) PCT No.: PCT/EP2014/077822
§ 371 (c)(1),
(2) Date: May 10, 2016

(87) PCT Pub. No.: WO2015/091392
PCT Pub. Date: Jun. 25, 2015

(65) Prior Publication Data
US 2016/0291331 A1    Oct. 6, 2016

(30) Foreign Application Priority Data
Dec. 16, 2013 (DE) .......... 10 2013 114 083

(51) Int. Cl.
*G02B 27/09* (2006.01)
*G02B 19/00* (2006.01)
(Continued)

(52) U.S. Cl.
CPC ......... *G02B 27/0966* (2013.01); *G02B 3/005* (2013.01); *G02B 3/0043* (2013.01);
(Continued)

(58) Field of Classification Search
CPC ............ G02B 27/0966; G02B 27/0916; G02B 27/095; G02B 27/0961; G02B 3/0043;
(Continued)

(56) References Cited

U.S. PATENT DOCUMENTS 5,333,077 A    7/1994 Legar
5,973,853 A *  10/1999 Gaebe ............... G02B 3/06
                                                359/668
(Continued)

FOREIGN PATENT DOCUMENTS

DE    102004002221 B3    5/2005
EP        1528425 A1     5/2005
(Continued)

OTHER PUBLICATIONS

International Search Report of PCT EP 2014077822, dated Feb. 19, 2015.
German Search Report of DE 102013114083.1, dated Aug. 6, 2014.

*Primary Examiner* — William R Alexander
(74) *Attorney, Agent, or Firm* — Cohen & Hildebrand, PLLC

(57) ABSTRACT

Device for shaping laser radiation (10a, 10c), comprising a component (1) having an entrance face (2) and an exit face (3), a first lens array (4) on the entrance face (2) with a plurality of lenses (5a, 5c, 5e) juxtaposed in the X-direction, and a second lens array (6) on the exit face (3) with a plurality of lenses (7a, 7c, 7e) juxtaposed in the Y-direction, wherein the laser radiation (10a, 10c) is deflected by a first one of the lenses (5a, 5c, 5e) of the first lens array (4) with respect to the X- and Y-direction by a different angle than from a second one of the lenses (5a, 5c, 5e) of the first lens array (4), and/or wherein the laser radiation (10a, 10c) is deflected by a first of the lenses (7a, 7c, 7e) of the second lens array (6) with respect to the X- and Y-direction by a different angle than by a second one of the lenses (7a, 7c, 7e) of the second lens array (6).

25 Claims, 6 Drawing Sheets

(51) Int. Cl.
*G02B 6/42* (2006.01)
*G02B 3/00* (2006.01)
*G02B 6/28* (2006.01)
*H01S 5/40* (2006.01)

(52) U.S. Cl.
CPC ......... *G02B 3/0068* (2013.01); *G02B 6/2848* (2013.01); *G02B 6/4206* (2013.01); *G02B 19/0014* (2013.01); *G02B 19/0057* (2013.01); *G02B 27/09* (2013.01); *G02B 27/0916* (2013.01); *G02B 27/0961* (2013.01); *H01S 5/405* (2013.01); *H01S 5/4012* (2013.01); *H01S 5/4031* (2013.01); *H01S 5/4075* (2013.01)

(58) Field of Classification Search
CPC .... G02B 3/005; G02B 3/0068; G02B 6/2848; G02B 6/4206; G02B 19/0014; G02B 19/0057; G02B 27/09
USPC .................................. 359/624, 618, 619, 621
See application file for complete search history.

(56) References Cited

U.S. PATENT DOCUMENTS

| | | | |
|---|---|---|---|
| 6,407,870 B1 * | 6/2002 | Hurevich | G02B 27/09 359/629 |
| 6,504,650 B1 | 1/2003 | Alfrey | |
| 6,700,709 B1 * | 3/2004 | Fermann | G02B 27/09 359/641 |
| 7,260,131 B2 | 8/2007 | Grenier et al. | |
| 2005/0105189 A1 | 5/2005 | Mikhailov | |
| 2005/0232628 A1 | 10/2005 | von Freyhold et al. | |
| 2007/0116079 A1 | 5/2007 | Giniunas et al. | |
| 2011/0002042 A1 * | 1/2011 | Kuroda | G01C 15/004 359/641 |
| 2011/0110626 A1 * | 5/2011 | Aschke | H01S 5/4012 385/33 |

FOREIGN PATENT DOCUMENTS

| | | |
|---|---|---|
| EP | 2309309 A2 | 4/2011 |
| JP | 2004061949 A | 2/2004 |

* cited by examiner

DEVICE FOR SHAPING LASER RADIATION

This is an application filed under 35 USC §371 of PCT/EP2014/077822, filed on Dec. 15, 2014 claiming priority to DE 10 2013 114 083.1, filed on. Dec. 16, 2013, each of which is herein incorporated by reference in its entirety.

BACKGROUND OF THE INVENTION

The present invention relates to a device for shaping laser radiation according to the preamble of claim 1.

Definitions: In the direction of propagation of the laser radiation refers to an average propagation direction of the laser radiation, in particular if the laser radiation is not a plane wave, or is at least partially divergent. Laser beam, light beam, partial beam or beam does not, unless expressly stated otherwise, refer to an idealized beam of geometrical optics, but to a real light beam, such as a laser beam with a Gaussian profile or a top-hat profile, which has not an infinitesimally small, but rather an extended beam cross section. Light shall not only refer to the visible spectrum, but also to the infrared and ultraviolet spectral region, respectively. Wedge-shaped shall not imply that flat surfaces are present, but that the extent of a wedge-shaped structure decreases or increases, when advancing in one direction, in one or two directions perpendicular or inclined to that one direction. The term wedge-shaped should therefore cover both flat surfaces such as faces of wedges and pyramids, as well as curved surfaces such as partial surfaces of cones.

A device of the aforementioned type is known, for example, from EP 2 309 309 A2. This device is particularly well suited to produce a homogeneous near field at a fiber output, which is advantageous for pumping solid state lasers. The monolithic fiber coupler described in EP 2 309 309 A2 takes advantage of the fact that the theoretically possible brilliance from a laser diode bar is not needed in some applications, but that a smaller brilliance suffices. The individual emitters of the laser diode bar can then be imaged with an optical system onto the optical fiber. However, the optical fiber must be able to convey the beam parameter product of the entire laser diode bar in the slow axis.

BRIEF SUMMARY OF THE INVENTION

The problem to be solved by the present invention is thus to provide a device of the aforementioned kind, which achieves a higher brilliance and/or is constructed more effectively, wherein in particular the product of the core diameter and the numerical aperture of the optical fiber has to correspond only approximately to the beam parameter product of a single emitter of the laser diode bar in the slow axis.

This is attained with the invention by a device of the aforementioned kind with the characterizing features of claim 1. The dependent claims relate to preferred embodiments of the invention.

According to claim 1, the first lens array is designed so that the laser radiation is deflected with respect to the first direction by a first one of the lenses of the first lens array and/or with respect to the second direction at an angle different from a second one of the lenses of the first lens array, and/or that the second lens array is designed so that the laser radiation is deflected with respect to the first direction by a first one of the lenses of the second lens array and/or with respect to the second direction at a different angle than by a second one of the lenses of the second lens array. One or a plurality of the lenses of the first lens array can deflect the laser radiation emanating from the individual emitters of a laser diode bar with respect to the second direction, in particular such that the laser radiations emanating from different lenses of the first lens array are incident on different lenses of the second lens array that are spaced from each other in the second direction.

In particular, the first lens array and/or the second lens array may be designed so that laser radiation having passed through a lens of the first lens array laser passes precisely through a lens of the second lens array wherein, in particular, the number of lenses of the first lens array corresponds exactly to the number the lenses of the second lens array. Thus, when the device is used for shaping the laser radiation emanating from a laser diode bar or a stack of laser diode bars, the first direction corresponds to the slow axis and the second direction corresponds to the fast axis. With this configuration, the laser radiation from each emitter of the laser diode bar will be incident on the entrance face of a matched lens which in addition to collimation or imaging also impresses on the Poynting vector of the laser radiation an angle in the fast axis direction and in the slow axis direction. On the entrance face of the component, the number of the lenses arranged next to each other along the slow axis corresponds to the number of emitters of the laser diode bar. The angle impressed on the Poynting vector of the laser beam along the fast axis direction and the slow axis direction can be selected in particular so that the laser radiation of the emitters is incident on the exit face of the component in the direction of the fast axis on different lenses. The number of lenses superimposed along the fast axis thus corresponds to the number of the emitters of the laser diode bar also on the exit face of the component.

The entrance face in the first direction may be wider than the exit face and/or the exit face in the second direction may be wider than the entrance face. This takes into account the lenses arranged next to each other in the different directions on the entrance face and the exit face.

Different lenses of the first lens array may have a different wedge-shaped structure, in particular with respect to the second direction, and/or different lenses of the second lens array may have a different wedge-shaped structure, in particular with respect to the first direction. Due to the different wedge-shaped structure with respect to the second direction of the lenses of the first lens array, the laser radiation emanating therefrom is incident on different lenses of the second lens array that are arranged next to each other in the second direction. Furthermore, due to the different wedge-shaped structure with respect to the first direction of the lenses of the second lens array, the laser radiation incident on these lenses is refracted again toward the optical axis of the device.

Furthermore, the lenses of the first lens arrays may be offset relative to each other in the second direction and/or the lenses of the second lens arrays may be offset relative to each other in the first direction. These offsets operate much like the wedge-shaped structures and aid the wedge-shaped structures in deflecting the laser beams.

In particular, the lenses of the first lens array and/or the lenses of the second lens array are constructed as cylindrical lenses or cylinder-like lenses. In this way, with respect to imaging or collimation, the lenses of the first lens array operate only on the fast axis and the lenses of the second lens array operate only to the slow axis of the laser radiation of the laser diode bar.

In particular, at least one of the cylinder axes of the cylindrical lenses or cylinder-like lenses of the first lens array may be aligned perpendicular to at least one of the cylinder axes of the cylindrical lenses or cylinder-like lenses of the second lens array.

Furthermore, the cylinder axes of the cylindrical lenses or of the cylinder-like lenses of the first lens array may be either parallel to the first direction or enclose with the first direction an angle of less than 45°, preferably less than 35°, in particular less than 25°, and/or the cylinder axes of the cylindrical lenses or cylinder-like lenses of the second lens array may be either parallel to the second direction or enclose with the second direction an angle of less than 45°, preferably less than 35°, in particular less than 25°.

The cylinder axes of at least two of the cylindrical lenses or cylinder-like lenses of the first lens array may enclose with each other an angle greater than 0° and smaller than 25°, preferably an angle greater than 0° and smaller than 15°, in particular an angle greater than 0° and smaller than 10° and/or the cylinder axes of at least two of the cylindrical lenses or cylinder-like lenses of the second lens array may enclose with each other an angle greater than 0° and smaller than 25°, preferably an angle greater than 0° and smaller than 15°, in particular an angle greater than 0° and smaller than 10°.

With these measures, the laser beams originating from individual emitters juxtaposed in the slow axis of a laser diode bar in the first direction or in the slow-axis direction are deflected towards the optical axis. This deflection can be supported, for example, by different wedge-shaped structures of the lenses of the first lens array in the first direction.

More particularly, at least one of the cylindrical lenses or cylinder-like lenses of the first lens array may be designed to image laser radiation emanating from an emitter of the laser diode bar or of the stack of laser diode bars with respect to the second direction onto the entrance face of an optical fiber or to collimate the laser radiation with respect to the second direction and/or at least one of the cylindrical lenses or cylinder-like lenses of the second lens array may be designed to image laser radiation emanating from an emitter of the laser diode bar or stack of laser diode bars with respect to the first direction onto the entrance face of an optical fiber or to collimate the laser radiation with respect to the first direction. In particular, by imaging with respect to the fast axis and the slow axis, the laser radiation from a laser diode bar can be coupled into an optical fiber with high brilliance using a single component.

It is particularly advantageous when the component is a monolithic component.

The lenses of the first lens array and/or the lenses of the second lens array may essentially shape the laser radiation in each case only with respect to the first or with respect to the second direction. However, alternatively, the lenses of the first lens array and/or the lenses of the second lens array may each shape the laser radiation with respect to both the first direction and the second direction.

In particular, the lenses of the first lens array may collimate the laser radiation with respect to the second direction, which may for example correspond to the fast axis, and the lenses of the second lens array may focus the laser radiation with respect to the second direction and image the laser radiation with respect to the first direction, which may for example correspond to the slow axis. The lenses of the second lens array may have different curvatures with respect to the first and the second direction.

Alternatively or additionally, the lenses of the first and second lens arrays may each operate in one axis as a telescope, such as a Galilean telescope or a Kepler telescope, or as a thick lens.

According to another embodiment, the optical system may operate as described above, but collimated and reordered light may emerge from the lenses of the second lens array. This light is then focused with a particularly inexpensive round lens.

In the collimating embodiment, a telescope arrangement may advantageously be constructed for each emitter in the fast axis, with collimation occurring only in the slow axis. In this way, the boundary condition that the distance between the emitters and the optical system, on the one hand, and the thickness of the optical system for both axes, on the other hand, must be equal can be satisfied so that the beam quality of the source is preserved in both axes. The term beam quality or beam parameter product (SPP) on the source side refers to the product of beam radius at the waist and half the far field angle. On the side of the fiber input, this term refers to the product of the beam radius at the fiber location and half the far field angle. When the optical parameters are not favorably selected, as is customary in the prior art, it is generally not possible that this product at fiber location corresponds to the beam parameter product of the source in both axes.

However, the device according to the invention may shape not the light en anating from a laser diode bar, but the light emanating from other types of laser light sources. For example, any lasers arranged in a row or juxtaposed fiber outputs, from which laser light exits, or a quantum cascade laser may be used.

The lenses may be designed as tilted and/or decentered cylindrical lenses or may have any type of free-form surfaces.

Furthermore, the lens centers of the lenses of the first lens array may have different distances to their associated light source. This is advantageous because the optical paths, for example, from the respective emitters of a laser diode bar to the backside of the device can be significantly different. This would make imaging with regard to the second direction or the slow axis significantly more difficult.

Furthermore, the surfaces of the lenses may be described, for example, with extended polynomials. For example, linear terms in the first and the second direction can then be used for the wedge functions. Furthermore, terms with even exponents in the first direction for the curvature with respect to the first direction can be used for the curvature with respect to the first direction, and terms with even exponents in the second direction for the curvature in the second direction can be used for the curvature with respect to the second direction. Moreover, mixed terms with respect to the first and second directions can be used to further improve the design of the surfaces.

By using suitable software, the lens elements can be optimized as any type of free-form elements.

BRIEF DESCRIPTION OF THE DRAWINGS

The invention will now be described in more detail with reference to the accompanying drawings, which show in.

DETAILED DESCRIPTION OF THE INVENTION

Figure 4:
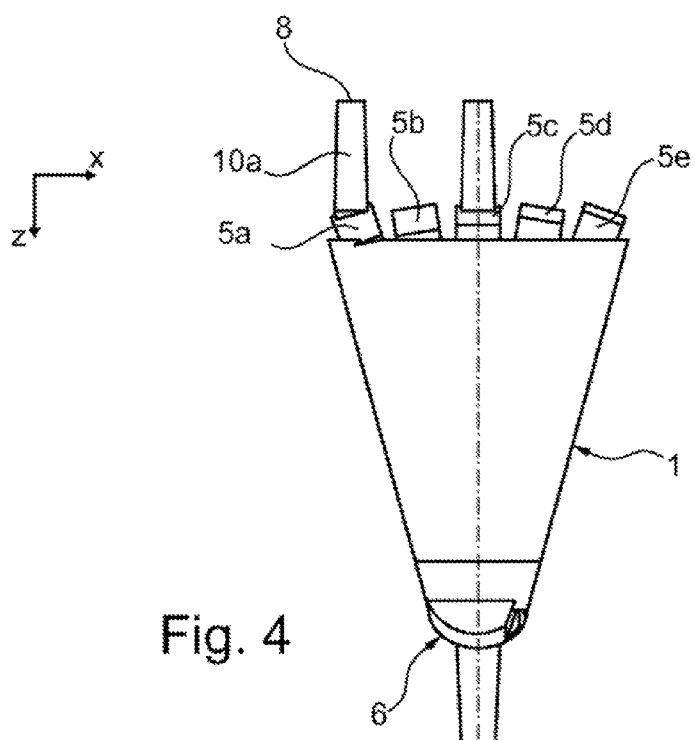
FIG. 4 a plan view of the device shown in FIG. 1 with schematically indicated laser radiation.
Figure 5:
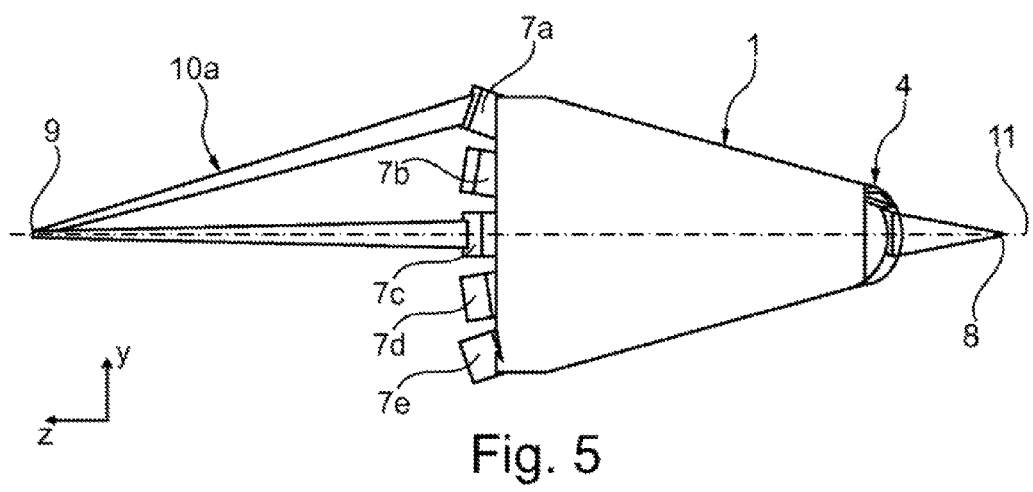
FIG. 5 a side view of the device shown in FIG. 1 with schematically indicated laser radiation.

In the figures, identical or functionally identical parts or light beams are designated with identical reference numerals. Furthermore, for improved clarity, Cartesian coordinate systems are shown in the figures. In addition, an optical axis 11 for illustration is indicated in FIG. 4 and FIG. 5.

FIG. 6 to FIG. 9 illustrate only superficially the optically functional lens surfaces and represent these as separate components. However, the device according to the present invention provides, as described hereinafter in detail, a substrate or a monolithic component, in which the lens surfaces are integrated.

The device illustrated in FIG. 1 to FIG. 5 is formed as a monolithic transparent component 1 having an entrance face 2 and an exit face 3. The entrance face 2 and the exit face 3 are arranged here opposite to each other in the Z-direction of the depicted coordinate system (see FIG. 1). The Z-direction hence corresponds to the propagation direction of the laser radiation to be shaped.

A first lens array 4, which has a plurality of juxtaposed lenses 5a, 5b, 5c, 5d, 5e in a first direction corresponding to the X-direction of the depicted coordinate system, is disposed on the entrance face 2. To simplify the drawing, only five lenses 5a, 5b, 5c, 5d, 5e are shown. However, more or fewer than five lenses may be provided.

Figure 2:
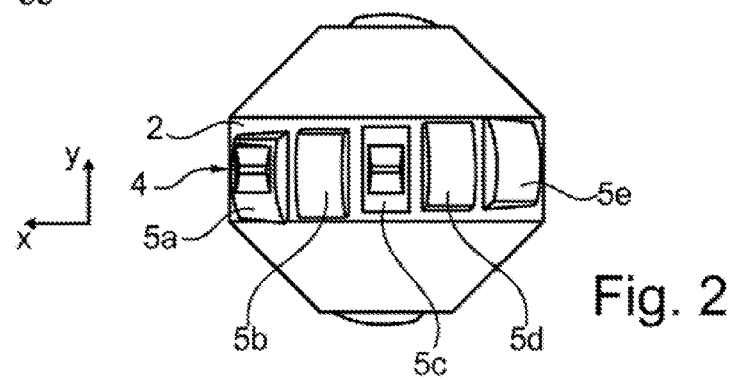
FIG. 2 a front view of the device of FIG. 1.
Figure 3:
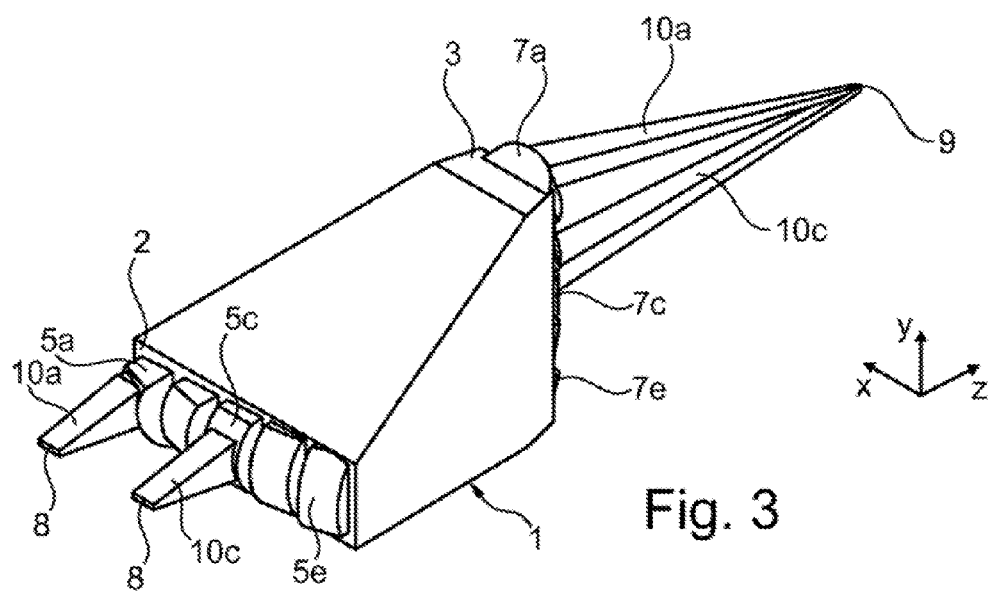
FIG. 3 a view similar to FIG. 1 onto the device with schematically indicated laser radiation.

The lenses 5a, 5b, 5c, 5d, 5e are offset from each other in a second direction that corresponds to the Y-direction of the depicted coordinate system (see FIG. 2). The lens 5a disposed in FIG. 2 on the left side is positioned with respect to the Y-direction at the bottom edge of the entrance face 2, whereas the lens 5e disposed at the right edge is positioned with respect to the Y-direction at the top edge of the entrance face 2. The intermediate lens 5c is positioned approximately in the center also with respect to the Y-direction. The two lenses 5b and 5d assume with respect to the Y-direction in each case intermediate positions between the outer lenses 5a, 5e and the intermediate lens 5c.

Figure 1:
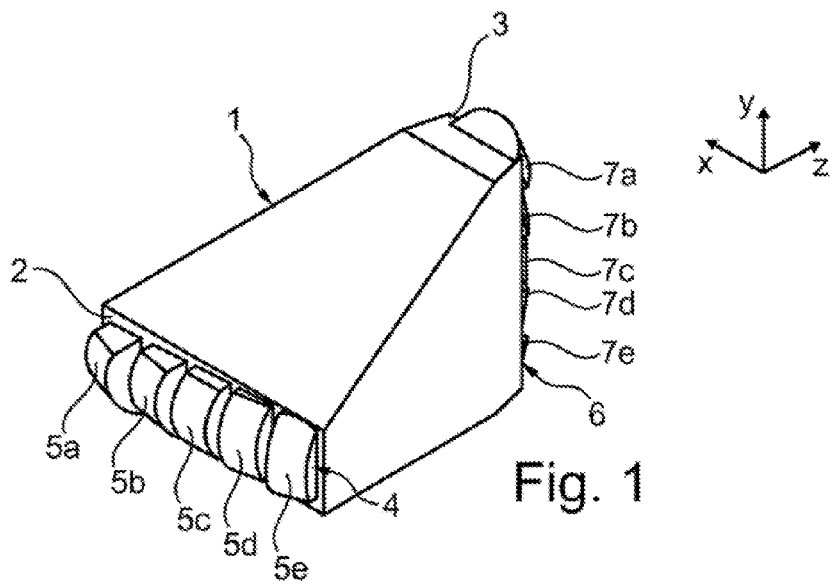
FIG. 1 a perspective view of a first embodiment of a device according to the invention.

Furthermore, the lenses 5a, 5b, 5c, 5d, 5e of the first lens array 4 differ from each other by a respective different wedge-shaped structure in the Y-direction. FIG. 1 shows that the lens 5a disposed on the left side is wider in the Z-direction at the upper edge in relation to the Y-direction than at its lower edge. The lens 5e disposed on the right side is narrower in the Z-direction at the upper edge in relation to the Y-direction than at its lower edge. The other lenses 5b, 5c, 5d assume intermediate values.

The lenses 5a, 5b, 5c, 5d, 5e of the first lens array 4 are formed as cylindrical lenses or cylinder-like lenses, with their cylinder axes extending at least partly in the X-direction. The cylinder axis of the central lens 5c is here parallel to the X-direction, whereas the cylinder axes of the other lenses 5a, 5b, 5d, 5e enclose with the X-direction at an angle greater than 0°.

For example, FIG. 4 shows that the cylinder axes of the two outer lenses 5a and 5e enclose with the X-direction an angle of approximately 20° and −20°, respectively. FIG. 4 also shows that the cylinder axes of the two lenses 5b and 5d enclose with the X-direction an angle of approximately 10° and −10°, respectively.

The different orientation of the cylinder axes of the lenses 5a, 5b, 5c, 5d, 5e of the first lens array 4 can be accompanied by a different wedge-shaped structure of the lenses 5a, 5b, 5c, 5d, 5e in the X-direction, as seen for example from FIG. 1.

A second lens array 6 is disposed on the exit face 3 which has a plurality of juxtaposed lenses 7a, 7b, 7c, 7d, 7e in the second direction that corresponds to the Y-direction of the depicted coordinate system. To simplify the drawing, only five lenses 7a, 7b, 7c, 7d, 7e are shown in the figures. However, more or fewer than five lenses may be provided.

Figure 8:
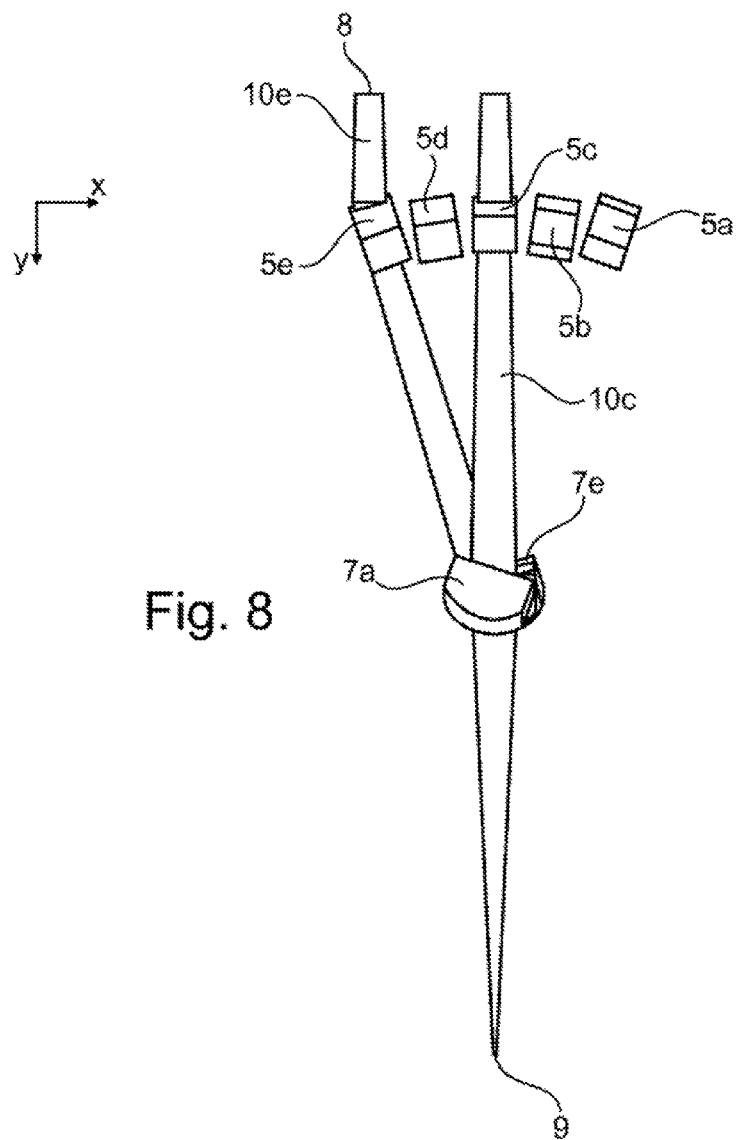
FIG. 8 a plan view of the schematic diagram of FIG. 6 with schematically indicated laser radiation.

The lenses 7a, 7b, 7c, 7d, 7e are offset from each other in the first direction that corresponds to the X-direction in the depicted coordinate system (see FIG. 8). The lens 7a disposed at the top edge in FIG. 8 is arranged with respect to the X-direction on the right edge of the exit face 3, whereas the lens 7e disposed at the bottom edge is arranged with respect to the X-direction on the left edge of the entrance face 2. The intermediate lens 7c is also arranged approximately in the middle with respect to the X-direction. The two lenses 7b and 7d assume with respect to the X-direction in each case intermediate positions between the outer lenses 7a, 7e and of the intermediate lens 7c.

Figure 7:
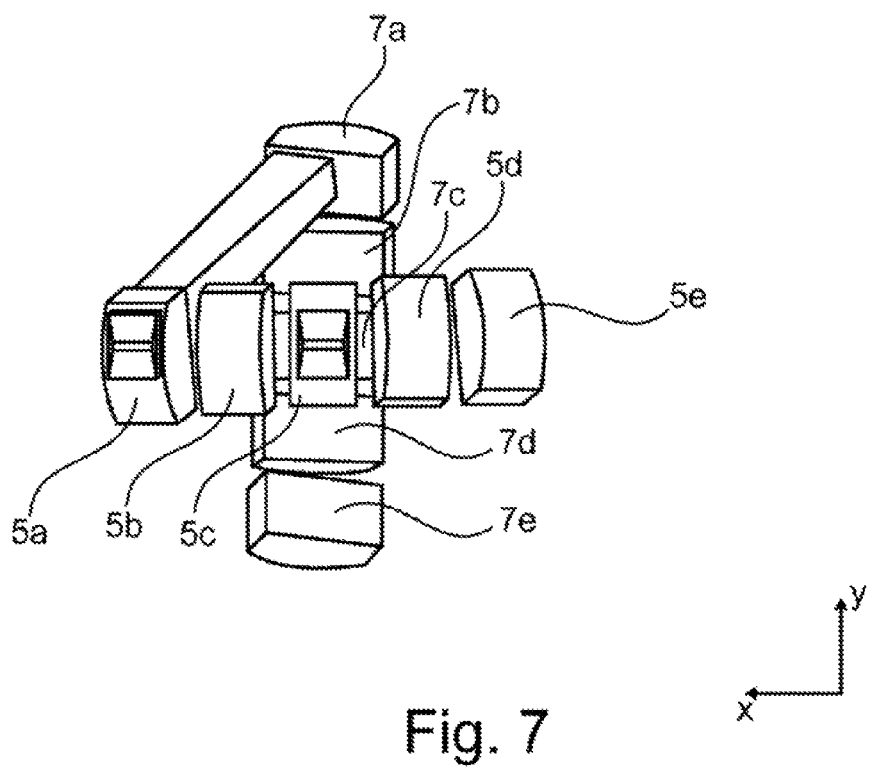
FIG. 7 a front view of the schematic diagram of FIG. 6 with schematically indicated laser radiation.

Furthermore, the lenses 7a, 7b, 7c, 7d, 7e of the second lens array 6 differ from each other by respective different wedge-shaped structures in the X-direction. FIG. 7 shows that the lens 7a disposed at the top is wider in the Z-direction at its left edge with respect to the X-direction than at its right edge. The lens 7e disposed at the bottom is narrower in the Z-direction at its left edge with respect to the X-direction than at its right edge. The other lenses 7b, 7c, 7d assume intermediate values.

The lenses 7a, 7b, 7c, 7d, 7e of the second lens array 6 are formed as cylindrical lenses or cylinder-like lenses, wherein their cylinder axes extend at least partly in the Y-direction. The cylinder axis of the central lens 7c is here parallel to the Y-direction, whereas the cylinder axes of the other lenses 7a, 7b, 7d, 7e enclose with the V-direction an angle greater than 0°.

In particular, FIG. 5 shows that the cylinder axes of the two outer lenses 7a and 7e enclose with the Y-direction an angle of approximately 20° and −20°, respectively. FIG. 5 also shows that the cylinder axes of the two lenses 7b and 7d enclose with the Y-direction an angle of about 10° and −10°, respectively.

The different orientation of the cylinder axes of the lenses 7a, 7b, 7c, 7d, 7e of the second lens array 6 may be accompanied by a different wedge-shaped structure of the lenses 7a, 7b, 7c, 7d, 7e in the Y-direction, as shown for example in FIG. 5.

Figure 9:
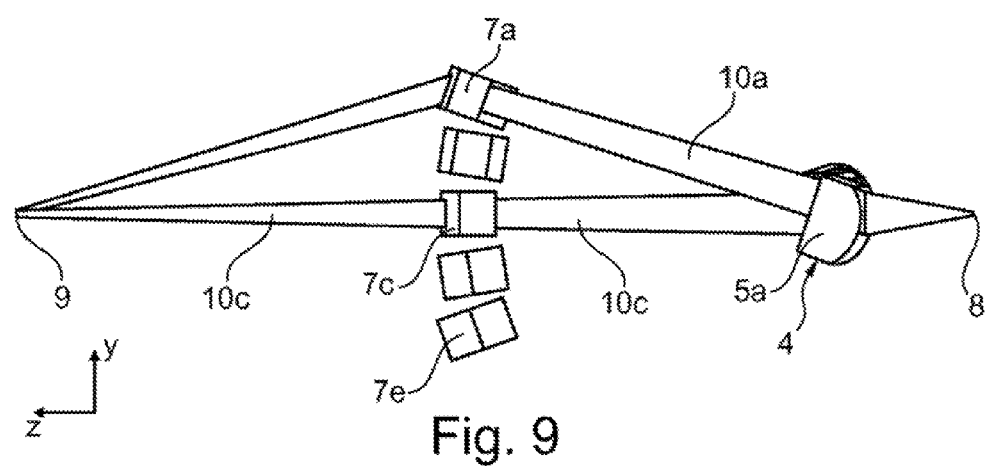
FIG. 9 a side view of the schematic diagram of FIG. 6 schematically indicated laser radiation.

The illustrated device can shape in particular the laser radiation 10a, 10b, 10c, 10d, 10e emanating from an unillustrated laser diode bar, wherein the individual emitters of the laser diode bar can each be disposed at the positions indicated with the reference numeral 8 in FIG. 3 to FIG. 6 and in FIG. 8 and FIG. 9. The X-direction corresponds here to the slow axis and the Y-direction to the fast axis of the laser diode bar.

Furthermore, the reference numeral 9 indicates a position, where for example the entrance face of an unillustrated optical fiber may be arranged in FIG. 3 to FIG. 6 and FIG. 8 and FIG. 9.

The lenses 5a, 5b, 5c, 5d, 5e of the first lens array 4 and the lenses 7a, 7b, 7c, 7d, 7e of the second lens array 6 each serve to deflect the incident laser radiation 10a, 10b, 10c, 10d, 10e as well as to image or collimate the laser radiation 10a, 10b, 10c, 10d, 10e. In particular, the schematic diagram of FIG. 9 illustrates that the lenses 5a, 5b, 5c, 5d, 5e of the first lens array 4 are able to image the laser radiation 10a, 10b, 10c, 10d, 10e emanating from the unillustrated individual emitters (see reference numeral 8) with respect to the fast axis or the Y-direction in each case on the unillustrated entry surface (see reference numeral 9) of the optical fiber.

At the same time, the tilted cylinder axes of the off-center lenses 5a, 5b, 5d, 5e of the first lens array 4 have the effect that the laser radiation 10a, 10b, 10d, 10e emanating therefrom is deflected in the X-direction toward the optical axis 11 (see FIG. 4, FIG. 6 and FIG. 8) and is incident on the lenses 7a, 7b, 7d, 7e of the second lens array 6. In particular, exactly one lens 7a, 7b, 7c, 7d, 7e of the second lens array 6 is assigned to each lens 5a, 5b, 5c, 5d, 5e of the first lens array 4 such that the laser radiation 10a, 10b, 10d, 10e, after having having passed through one of the lenses 5a, 5b, 5c, 5d, 5e of the first lens array 4, passes through exactly one lens 7a, 7b, 7c, 7d, 7e of the second lens array 6. This is clearly illustrated in FIG. 6.

In addition, the different wedge-shaped structures of the off-center lenses 5a, 5b, 5d, 5e of the first lens array 4 have the effect that the laser radiation 10a, 10b, 10d, 10e emanating therefrom is deflected away from the optical axis 11 upwardly and downwardly in the Y-direction (see FIG. 5, FIG. 6 and FIG. 9), and is incident on the respective lenses 7a, 7b, 7d, 7e of the second lens array 6.

Figure 6:
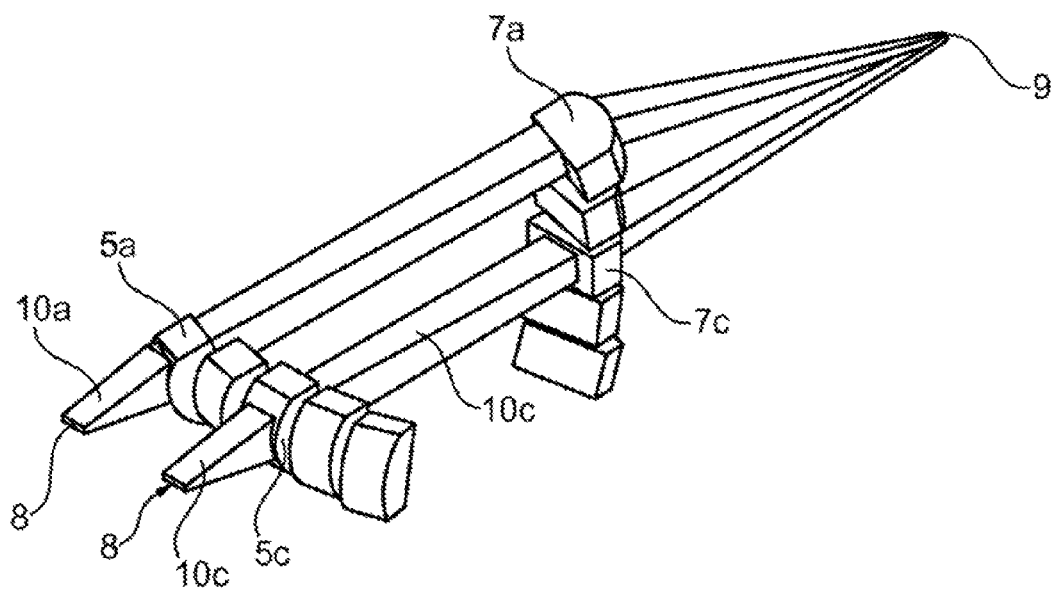
FIG. 6 a perspective schematic diagram of the device shown in FIG. 1 with schematically indicated laser radiation, emphasizing the function of the individual lenses.

It should be noted at this point that the intermediate lens 5c of the first lens array 4 has neither a tilted cylinder axis nor a wedge-shaped structure, so that the laser radiation 10c passing through this lens 5c is deflected neither with respect of the X-direction nor with respect to the Y-direction and is therefore incident on the intermediate lens 7c of the second lens array 6 (see FIG. 6). Imaging occurs here only with respect to the fast axis on the unillustrated entrance face (see reference numeral 9) of the optical fiber.

In the illustrated exemplary embodiment, laser radiation 10a passing through the lens 5a arranged on the left in FIG. 6 is deflected upward toward the top lens 7a, and the laser radiation 10b passing through the next lens 5b is deflected toward the lens 7b which is arranged below the lens 7a, and so on. This sequential order may also be reversed. Furthermore, the deflection of the laser radiation 10a, 10b, 10c, 10d, 10e need not be "cleanly sorted". For example, the laser radiation 10a, 10b emanating from two adjacent lenses 5a, 5b of the first lens array 4 may not be incident on adjacent lenses of the second lens array 6. Instead, the lens arrays 4, 6 may be designed and the laser radiation may hence be deflected in such a way that the optical path lengths of the different beam paths are particularly advantageous.

Furthermore, the schematic diagram of FIG. 8 shows that the lenses 7a, 7b, 7c, 7d, 7e of the second lens array 6 can image the laser radiation 10a, 10b, 10c, 10d, 10e emanating from unillustrated individual emitters (see reference numeral 8) with respect to the slow-axis or the X-direction in each case onto the unillustrated entrance face (see reference numeral 9) of the optical fiber.

At the same time, the tilted cylinder axes of the off-center lenses 7a, 7b, 7d, 7e of the second lens array 6 have the effect that the laser radiation 10a, 10b, 10d, 10e emanating from the off-center lenses 5a, 5b, 5d, 5e of the first lens array 4 is deflected in the X-direction so as to extend in an Y-Z plane (see FIG. 8).

In addition, the respective different wedge-shaped structures of the off-center lenses 7a, 7b, 7d, 7e of the second lens array 6 cause the laser radiation 10a, 10b, 10d, 10e emanating from the off-center lenses 5a, 5b, 5d, 5e of the first lens array 4 to be deflected in the Y-direction upwards and downwards toward the optical axis 11 (see FIG. 9) and to be incident on the unillustrated entrance face (see reference numeral 9) of the optical fiber.

It should be noted at this point that the center lens 7c of the second lens array 6 likewise has neither a tilted cylinder axis nor a wedge-shaped structure, so that the laser radiation 10c passing through this lens 70 is deflected neither with respect to the X-direction nor with respect to the Y-direction (see FIG. 6). The laser radiation 10c is instead imaged onto the unillustrated entrance face (see reference numeral 9) of the optical fiber only with respect to the slow axis.

Alternatively, the lenses 5a, 5b, 5c, 5d, 5e of the first lens array 4 and/or the lenses 7a, 7b, 7c, 7d, 7e of the second lens array 6 may not image, but rather collimate the radiation emanating from the individual emitters. The laser radiation collimated with respect to the slow axis and the fast axis can then be focused, for example, on the entrance face of an optical fiber by using inexpensive spherical optics.

Figure 10:
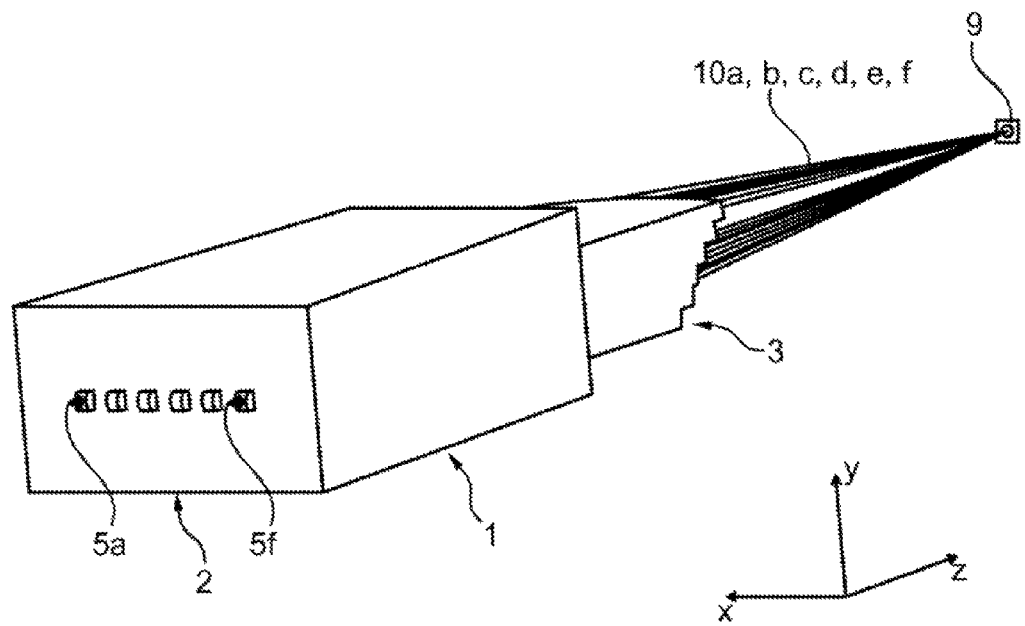
FIG. 10 a perspective front view of a second embodiment of a device according to the invention.
Figure 11:
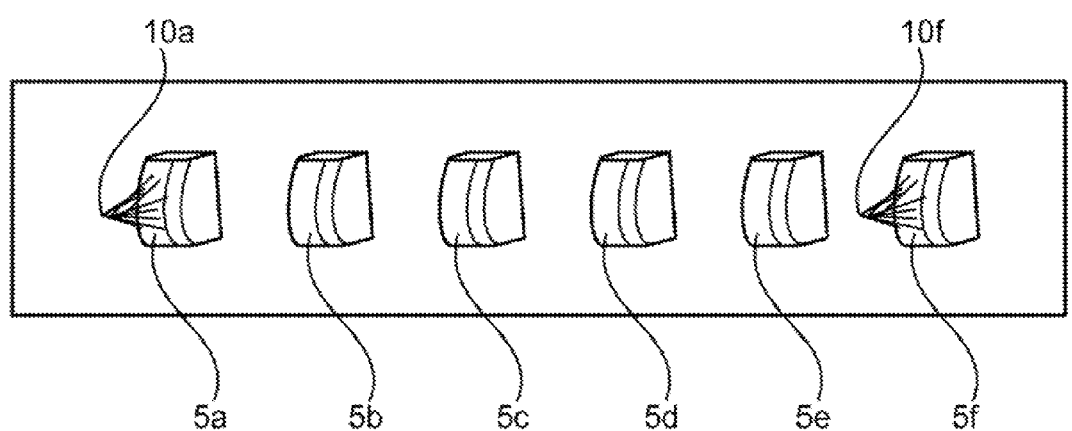
FIG. 11 an enlarged detail of the entrance face of the device of FIG. 10.
Figure 12:
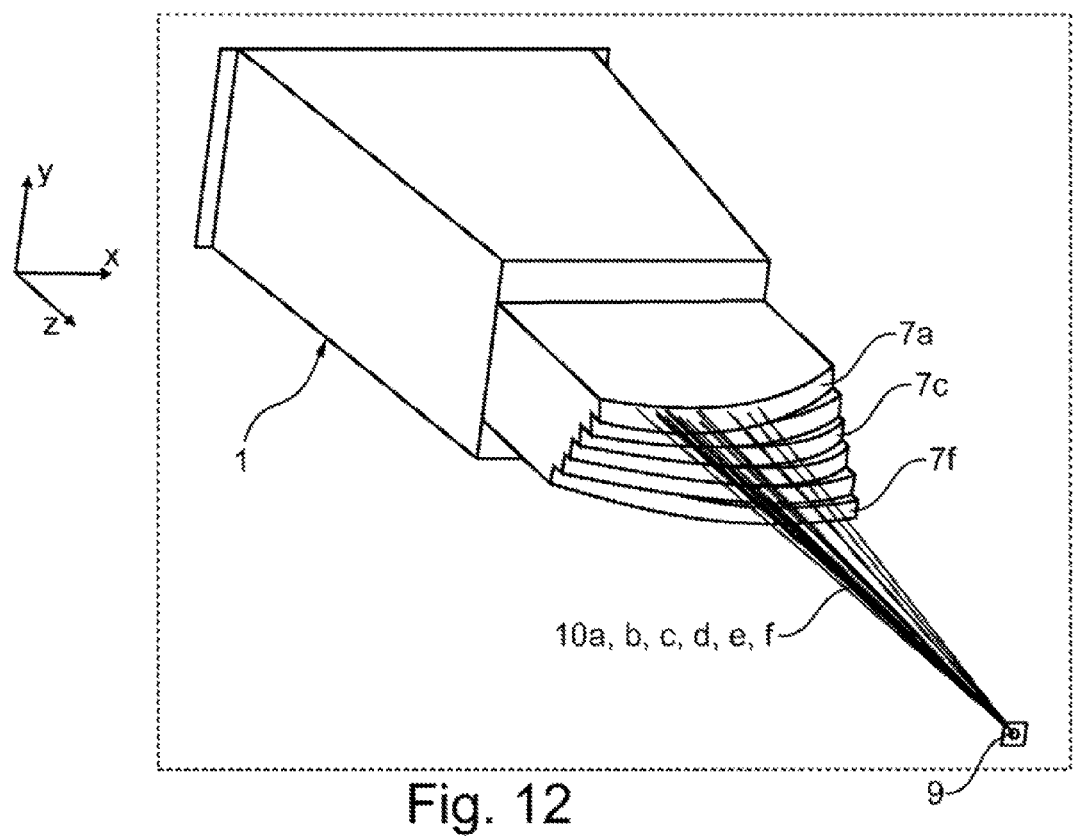
FIG. 12 a perspective rear view of the device of FIG. 10.
Figure 13:
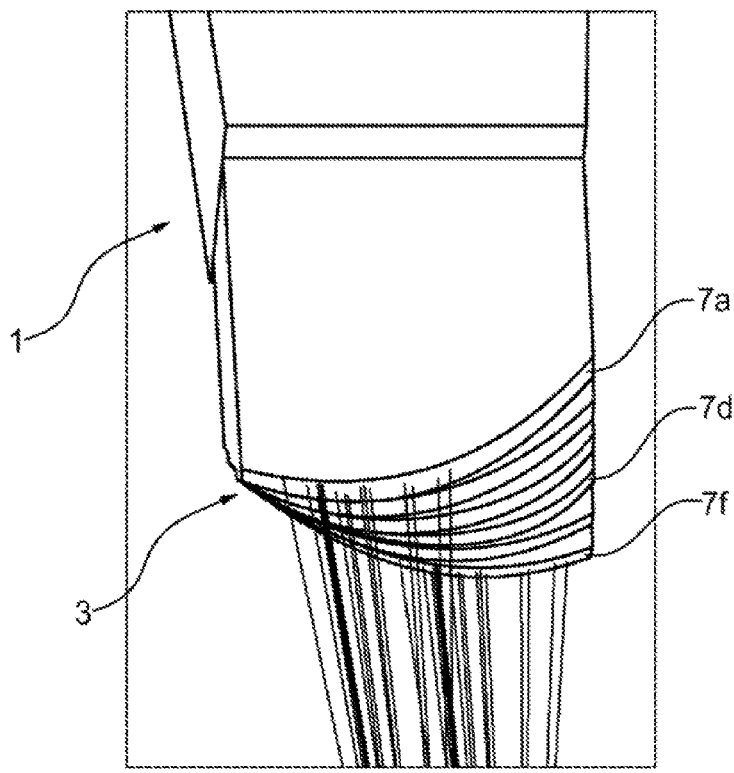
FIG. 13 a plan view of the area of the exit face of the device of FIG. 10.

The exemplary embodiment illustrated in FIGS. 10 to 1 of a device 1 according to the invention is also formed as a monolithic transparent component 1 having an entrance face 2 and an exit face 3. The entrance face 2 and the exit face 3 are here, arranged opposite to each other in the Z-direction of the indicated coordinate system (see FIG. 10). The Z-direction hence corresponds to the propagation direction of the laser radiation to be shaped.

In the exemplary embodiment of a device 1 of the invention shown in FIGS. 10 to 13, six lenses 5a, 5b, 5c, 5d, 5e, 5f of the first lens array 4 and six lenses 7a, 7b, 7c, 7d, 7e, 7f of the second lens array 6 are depicted on both the entrance face 2 and the exit face 3. However, more or fewer than six lenses may be provided. Preferably, 3 to 49 lenses, in particular 8 to 11 lenses may be used.

For example, 10 lenses may be provided, which can shape the laser radiation from an unillustrated miniature laser diode bar having 10 emitters. Specifically, the emitters of this miniature laser diode bar may have in the X-direction a width of 100 μm and a pitch of 500 μm.

In the embodiment illustrated in FIG. 10 to FIG. 13, the six lenses 5a, 5b, 5c, 5d, 5e, 5f are different from each other, wherein respective pairs of the lenses 5a, 5f; 5b, 5e; 5c, 5d are mirror-symmetric. The lenses 5a, 5b, 5c, 5d, 5e, 5f, each have a curvature both in the X-direction and in the Y-direction. Furthermore, they have a substantially convex shape and deflect the laser radiation 10a, 10b, 10c, 10d, 10e, 10f of each respective emitter in the X- and Y-direction. In particular, the lenses 5a, 5b, 5c, 5d, 5e, 5f also have the wedge-shaped structure described in connection with FIG. 1 to FIG. 9.

The surfaces of the lenses 5a, 5b, 5c, 5d, 5e, 5f can be described by mixed polynomials, wherein not only even terms occur for each axis, but also mixed terms in X and Y. Odd terms in X and Y having a higher order than the first order may also be required.

The lenses are arranged in the X-direction side-by-side. The apexes of the lenses 5a, 5b, 5c, 5d, 5e, 5f are not necessary arranged in a line, although the lens apertures may very well be symmetric with respect to the centers of the individual emitters.

The general shape of the lenses 7a, 7b, 7c, 7d, 7e, 7f on the exit face 3 is similar to the shape of the lenses 5a, 5b, 5c, 5d, 5e, 5f on the entrance face 2. In particular, the lenses 7a, 7b, 7c, 7d, 7e, 7f are also convex, have curvatures in both X- and Y-axes and can be described by even and odd mixed polynomial terms in X and Y.

The width in the X-direction is typically considerably larger than on the entrance face 2. For example, the width of the lenses 5a, 5b, 5c, 5d, 5e, 5f on the entrance face 2 in the X-direction may in each case be less than 500 µm, whereas the width of the lenses 7a, 7b, 7c, 7d, 7e, 7f on the exit face 3 in X-direction may be from 500 µm to 2500 µm. The height of the lenses 5a, 5b, 5c, 5d, 5e, 5f; 7a, 7b, 7c, 7d, 7e, 7f on the entrance face 2 and the exit face 3 in the Y-direction is typically in the range of 100 µm to 1000 µm, in particular between 200 µm and 600 µm.

FIGS. 10 to 13 show that the lenses 5a, 5b, 5c, 5d, 5e, 5f; 7a, 7b, 7c, 7d, 7e, 7f on the entrance face 2 and the exit face 3 are curved in two axes X, Y and are formed as free-form surfaces. Furthermore, it is apparent that the component 1 is monolithic. The apexes of the lenses 7a, 7b, 7c, 7d, 7e, 7f on the exit face 3 are positioned closer to the optical axis than the apexes of the lenses 5a, 5b, 5c, 5d, 5e, 5f on the entrance face 2. The lens apertures of the lenses 5a, 5b, 5c, 5d, 5e, 5f on the entrance face 2 are symmetrical with respect to the emitters, whereas the lens apertures of the lenses 7a, 7b, 7c, 7d, 7e, 7f are stacked on the exit face 3 in the Y-direction.

Example 1

The exemplary embodiment depicted in FIGS. 10 to 13 can couple the light from a miniature bar with 10 emitters having in the X-direction a width of 100 µm and a center-to-center spacing of 500 µm and a wavelength of 976 nm into an optical fiber having a core diameter of 100 µm and an NA of 0.15.

The coupling efficiency for a design of the component made of quartz glass is, according to a simulation, 76% for the entire miniature bar (85% for the center emitter and 64% for the two outer emitters).

The fiber in the example is especially selected for use as a pump source for fiber lasers. Another application relates to miniature bars with a wavelength of approximately 640 nm for laser projectors for a cinema.

A higher coupling efficiency will likely result when a material with a very high refractive index, such as S-TIH53, is used for the component.

The invention claimed is:

1. A device for shaping laser radiation (10a, 10b, 10c, 10d, 10e, 10f), comprising:
   a component (I) having an entrance face (2) and an exit face (3),
   a first lens array (4) on the entrance face (2) for deflecting and/or imaging and/or collimating the laser radiation (10a, 10b, 10c, 10d, 10e, 10f) the first lens array (4) comprising a plurality of lenses (5a, 5b, 5c, 5d, 5e, 5f), arranged side-by-side in a first direction (X), as well as
   a second lens array (6) on the exit face (3) for deflecting and/or imaging and/or collimating the laser radiation (10a, 10b, 10c, 10d, 10e, 10f), the second lens array comprising a plurality of lenses (7a, 7b, 7c, 7d, 7e, 7f) arranged side-by-side in a second direction (Y) that is perpendicular to the first direction (X),
   wherein
   the first lens array (4) is designed so that the laser radiation (10a, 10b, 10c, 10d, 10e, 10f) is deflected by a first one of the lenses (5a, 5b, 5c, 5d, 5e, 5f) of the first lens array (4) with respect to the first direction (X) and/or with respect to the second direction (Y) by a different angle than by a second one of the lenses 5a, 5b, 5c, 5d, 5e, 5f) of the first lens array (4),
   and/or wherein
   the second lens array (6) is designed so that the laser radiation (10a, 10b, 10c, 10d, 10e, 10f) is deflected by a first one of the lenses (7a, 7b, 7c, 7d, 7e, 7f) of the second lens array (6) with respect to the first direction (X) and/or with respect to the second direction (Y) by a different angle than by a second one of the lenses (7a, 7b, 7c, 7d, 7e, 7f) of the second tens array (6),
   wherein the first lens array (4) and/or the second lens array (6) are designed such that laser radiation (10a, 10b, 10c, 10d, 10e, 10f), after having passed through a lens (5a, 5b, 5c, 5d, 5e, 5f) of the first lens array (4), passes precisely through one lens (7a, 7b, 7c, 7d, 7e, 7f) of the second lens array (6).

2. The device according to claim 1, wherein the entrance face (2) is wider than the exit face (3) in the first direction (X) and/or that the exit face (3) is wider than the entrance face (2) in the second direction (Y).

3. A device for shaping laser radiation (10a, 10b, 10c, 10d, 10e, 10f), comprising:
   a component (1) having an entrance face (2) and an exit face (3),
   a first lens array (4) on the entrance face (2) for deflecting and/or imaging and/or collimating the laser radiation (10a, 10b, 10c, 10d, 10e, 10f), the first lens array (4) comprising a plurality of lenses (5a, 5b, 5c, 5d, 5e, 5f), arranged side-by-side in a first direction (X), as well as
   a second lens array (6) on the exit face (3) for deflecting and/or imaging and/or collimating the laser radiation (10a, 10b, 10c, 10d, 10e, 10f), the second lens array comprising a plurality of lenses (7a, 7b, 7c, 7d, 7e, 7f) arranged side-by-side in a second direction (Y) that is perpendicular to the first direction (X),
   wherein
   the first lens array (4) is designed so that the laser radiation (10a, 10b, 10c, 10d, 10e, 10f) is deflected by a first of the lenses (5a, 5b, 5c, 5d, 5e, 5f) of the first lens array (4) with respect to the first direction (X) and/or with respect to the second direction (Y) by a different angle than by a second one of the lenses (5a, 5b, 5c, 5d, 5e, 5f) of the first lens array (4),
   and/or wherein
   the second lens array (6) is designed so that the laser radiation (10a, 10b, 10c, 10d, 10e, 10f) is deflected by a first of the lenses (7a, 7b, 7c, 7d, 7e, 7f) of the second lens array (6) with respect to the first direction (X) and/or with respect to the second direction (Y) by a different angle than by a second one of the lenses (7a, 7b, 7c, 7d, 7e, 7f) of the second lens array (6),
   wherein different lenses (5a, 5b, 5c, 5d, 5e, 5f) of the first lens array (4) have a different wedge-shaped structure.

4. The device according to claim 1, wherein the lenses (5a, 5b, 5c, 5d, 5e, 5f) of the first lens array (4) are arranged with a mutual offset in the second direction (Y) and/or that the lenses (7a, 7b, 7c, 7d, 7e, 7f) of the second lens array (6) are arranged with a mutual offset in the first direction (X).

5. The device according to claim 3, wherein the lenses (5a, 5b, 5c, 5d, 5e, 5f) of the first lens array (4) and/or the lenses (7a, 7b, 7c, 7d, 7e, 7f) of the second lens array (6) are constructed as cylindrical lenses or cylinder-like lenses each having cylinder axes.

6. The device according to claim 5, wherein at least one of the cylinder axes of the cylindrical lenses or the cylinder-like lenses (5a, 5b, 5c, 5d, 5e, 5f) of the first lens array (4) is aligned perpendicular to at least one of the cylinder axes of the cylindrical lenses or the cylinder-like lenses (7a, 7b, 7c, 7d, 7e, 7f) of the second lens array (6).

7. The device according to claim 1, wherein the lenses (5a, 5b, 5c, 5d, 5e, 5f) of the first lens array (4) and/or the lenses (7a, 7b, 7c, 7d, 7e, 7f), of the second lens array (6) are constructed as cylindrical lenses or cylinder-like lenses, each having cylinder axes,
the cylinder axes of the cylindrical lenses or cylinder-like lenses (5a, 5b, 5c, 5d, 5e, 5f) of the first lens array (4) are either parallel to the first direction (X) or enclose with the first direction (X) an angle of less than 45°, and/or
the cylinder axes of the cylindrical lenses or the cylinder-like lenses (7a, 7b, 7c, 7d, 7e, 7f) of the second lens array (6) are either parallel to the second direction (Y), or enclose with the second direction (Y) an angle of less than 45°.

8. The device according to claim 5, wherein
the cylinder axes of the cylindrical lenses or cylinder-like lenses (5a, 5b, 5c, 5d, 5e, 5f) of the first lens array (4) are either parallel to the first direction (X) or enclose with the first direction (X) an angle of less than 45°, and/or that
the cylinder axes of the cylindrical lenses or the cylinder-like lenses (7a, 7b, 7c, 7d, 7e, 7f) of the second lens array (6) are either parallel to the second direction (Y), or enclose with the second direction (Y) an angle of less than 45°.

9. The device according to claim 1, wherein the device is used for shaping laser radiation (10a, 10b, 10c, 10d, 10e, 10f) emanating from a laser diode bar or a stack of laser diode bars, wherein the first direction (X) corresponds to a slow axis and the second direction (Y) corresponds to a fast axis.

10. The device according to claim 9, wherein the lenses (5a, 5b, 5c, 5d, 5e, 5f) of the first lens array (4) and/or the lenses (7a, 7b, 7c, 7d, 7e, 7f) of the second lens array (6) are constructed as cylindrical lenses or cylinder-like tenses, each having cylinder axes,
at least one of the cylindrical lenses or the cylinder-like lenses (5a, 5b, 5c, 5d, 5e, 5f) of the first lens array (4) is designed so as to be able to image or collimate the laser radiation (10a, 10b, 10c; 10d, 10e, 10f) emanating from an emitter of the laser diode bar or the stack of laser diode bars with respect to the second direction (Y) onto the entrance face of an optical fiber and/or
at least one of the cylindrical lenses or the cylinder-like lenses (7a, 7b, 7c, 7d, 7e, 7f) of the second lens array (6) is designed so as to be able to image or collimate the laser radiation (10a, 10b, 10c, 10d, 10e, 10f) emanating from an emitter of the laser diode bar or the stack of laser diode bars with respect to the first direction (X) onto the entrance face of an optical fiber.

11. The device according to claim 3, wherein at least one of the lenses (5a, 5b, 5c, 5d, 5e, 5f) of the first lens array (4) and/or at least one of the lenses (7a, 7b, 7c, 7d, 7e, 7f) of the second lens array (6) are curved both with respect to the first direction (X) and with respect to the second direction (Y).

12. The device according to claim 3, wherein at least one of the lenses (5a, 5b, 5c, 5d, 5e, 5f) of the first lens array (4) and/or at least one of the lenses (7a, 7b, 7c, 7d, 7e, 7f) of the second lens array (6) are formed as free-form surfaces.

13. The device according to claim 1, wherein at least one of the lenses (7a, 7b, 7c, 7d, 7e, 7f) of the second lens array (6) are wider in the first direction (X) than at least one of the lenses (5a, 5b, 5c, 5d, 5e, 5f) of the first lens array (4).

14. The device according to claim 1, wherein the component (1) is a monolithic component (1).

15. The device according to claim 1, wherein the number of lenses (5a, 5b, 5c, 5d, 5e, 5f) of the first lens array (4) corresponds to the number of the lenses (7a, 7b, 7c, 7d, 7e, 7f) of the second lens array (6).

16. The device according to claim 3, wherein the different lenses (5a, 5b, 5c, 5d, 5e, 5f) of the first lens array (4) have the different wedge-shaped structure with regard to the second direction (Y).

17. The device according to claim 16, and further, wherein a different lenses (7a, 7b, 7c, 7d, 7e, 7f) of the second lens array (6) have a different wedge-shaped structure-with respect to the first direction (X).

18. The device according to claim 7, wherein
the cylinder axes of the cylindrical lenses or cylinder-like lenses (5a, 5b, 5c, 5d, 5e, 5f) of the first lens array (4) enclose with the first direction (X) an angle of less than 35°, and/or
the cylinder axes of the cylindrical lenses or the cylinder-like lenses (7a, 7b, 7c, 7d, 7e, 7f) of the second lens array (6) are either parallel to the second direction (Y), or enclose with the second direction (Y) an angle of less than 45°.

19. The device according to claim 7, wherein
the cylinder axes of the cylindrical lenses or cylinder-like lenses (5a, 5b, 5c, 5d, 5e, 5f) of the first lens array (4) enclose with the first direction (X) an angle of less than 35°, and/or that
the cylinder axes of the cylindrical lenses or the cylinder-like lenses (7a, 7b, 7c, 7d, 7e, 7f) of the second lens array (6) are either parallel to the second direction (Y), or enclose with the second direction (Y) an angle of less than 35°.

20. The device according to claim 7, wherein
the cylinder axes of the cylindrical lenses or cylinder-like lenses (5a, 5b, 5c, 5d, 5e, 5f) of the first lens array (4) enclose with the first direction (X) an angle of less than 25°, and/or that
the cylinder axes of the cylindrical lenses or the cylinder-like lenses (7a, 7b, 7c, 7d, 7e, 7f) of the second lens array (6) are either parallel to the second direction (Y), or enclose with the second direction (Y) an angle of less than 25°.

21. The device according to claim 11, wherein all of the lenses (5a, 5b, 5c, 5d, 5e, 5f) of the first lens array (4) and/or all of the lenses (7a, 7b, 7c, 7d, 7e, 7f) of the second lens array (6) are curved both with respect to the first direction (X) and with respect to the second direction (Y).

22. The device according to claim 12, wherein all of the lenses (5a, 5b, 5c, 5d, 5e, 5f) of the first lens array (4) and/or all of the lenses (7a, 7b, 7c, 7d, 7e, 7f) of the second lens array (6) are formed as free-form surfaces.

23. The device according to claim 13, wherein at least one of the lenses (7a, 7b, 7c, 7d, 7e, 7f) of the second lens array (6) is twice as wide in the first direction (X) than at least one of the lenses (5a, 5b, 5c, 5d, 5e, 5f) of the first lens array (4).

24. The device according to claim 14, wherein all of the lenses (7a, 7b, 7c, 7d, 7e, 7f) of the second lens array (6) are wider in the first direction (X) than all of the lenses (5*a*, 5*b*, 5*c*, 5*d*, 5*e*, 5*f*) of the first lens array (4).

25. The device according to claim 3, wherein the component (1) is a monolithic component (1).

* * * * *